United States Patent
Pan et al.

(10) Patent No.: US 11,271,565 B2
(45) Date of Patent: Mar. 8, 2022

(54) TOUCH OR PROXIMITY SENSING SYSTEM AND METHOD

(71) Applicant: TEXAS INSTRUMENTS INCORPORATED, Dallas, TX (US)

(72) Inventors: Yaohua Pan, Shanghai (CN); Jun Zhang, Shanghai (CN)

(73) Assignee: Texas Instruments Incorporated, Dallas, TX (US)

(*) Notice: Subject to any disclaimer, the term of this patent is extended or adjusted under 35 U.S.C. 154(b) by 229 days.

(21) Appl. No.: 16/741,614

(22) Filed: Jan. 13, 2020

(65) Prior Publication Data

US 2021/0050852 A1 Feb. 18, 2021

Related U.S. Application Data

(63) Continuation of application No. PCT/CN2019/100501, filed on Aug. 14, 2019.

(51) Int. Cl.
*H03K 17/96* (2006.01)
*H03K 17/945* (2006.01)

(52) U.S. Cl.
CPC ....... *H03K 17/9622* (2013.01); *H03K 17/945* (2013.01); *H03K 2217/960755* (2013.01)

(58) Field of Classification Search
CPC ............. H03K 17/9622; H03K 17/945; H03K 2217/960755

USPC ........................................................ 400/479.1
See application file for complete search history.

(56) References Cited

U.S. PATENT DOCUMENTS

| 9,575,599 B1* | 2/2017 | Wilson ................ G06F 3/04186 |
| 2014/0028605 A1* | 1/2014 | Luo ........................ G06F 3/0445 345/174 |
| 2016/0357280 A1* | 12/2016 | Wadia ................... G06F 3/0446 |
| 2017/0123486 A1* | 5/2017 | Willis ................. G06F 3/04166 |

OTHER PUBLICATIONS

International Search Report for PCT/CN2019/0100501 dated May 19, 2020.

* cited by examiner

*Primary Examiner* — Tomi Skibinski
(74) *Attorney, Agent, or Firm* — Brian D. Graham; Charles A. Brill; Frank D. Cimino

(57) ABSTRACT

A system for sensing touch or proximity include: a first number of input terminals configured to couple one or more capacitive sensors, a second number of transferring units configured to transfer charges from the one or more capacitive sensors through the first number of input terminals in transferring phases of cycles of the one or more capacitive sensor, wherein at least one of the first and second numbers is equal to or greater than two, and a first switching unit, coupled between the first number of input terminals and the second number of transferring units, configured to selectively electrically couple any one of the first number of input terminals to any one of the second number of transferring units in the transferring phases.

20 Claims, 14 Drawing Sheets

TOUCH OR PROXIMITY SENSING SYSTEM AND METHOD

TECHNICAL FIELD

The present disclosure relates to a sensing system and, more particularly, to a touch or proximity sensing system based on capacitance change of capacitive sensors.

BACKGROUND

Capacitive sensors are widely used in various applications, for example, in human interface applications to sense touch or proximity of a body, and in motor applications to determine a position of a rotatable shaft by determining proximity of a conductive object to a capacitive sensor mounted on the shaft. Touch or proximity to the capacitive sensor is determined by detecting a capacitance change between two opposite electrodes thereof.

SUMMARY

The present disclosure relates to touch or proximity sensing systems with improved noise immunity, configuration flexibility and averaged measurement errors. The touch or proximity is determined by detecting a capacitance change between two opposite electrodes of a capacitive sensor. The capacitance between the two electrodes of the capacitive sensor is measured by charging the capacitive sensor to a predetermined voltage and measuring the amount of charges charged to the capacitive sensor. The measurement includes transferring the charges to a sample capacitor by discharging the capacitive sensor.

In one example, a system for sensing touch or proximity is described. The system includes a first number of input terminals configured to couple one or more capacitive sensors, a second number of transferring units configured to transfer charges from the one or more capacitive sensors through the first number of input terminals in transferring phases of cycles of the one or more capacitive sensor, wherein at least one of the first and second numbers is equal to or greater than two, and a first switching unit, coupled between the first number of input terminals and the second number of transferring units, configured to selectively electrically couple any one of the first number of input terminals to any one of the second number of transferring units in the transferring phases.

In another example, the present disclosure provides a method of operating a touch or proximity sensing system including a first number of input terminals and a second number of transferring units. The method includes repeatedly charging one or more capacitive sensors in charging phases of cycles of the one or more capacitive sensors, and selectively configuring any one of a second number of transferring units to transfer charges from any one of the first number of capacitive sensor in transferring phases of the cycles, wherein at least one of the first and second numbers is equal to or greater than two.

DETAILED DESCRIPTION

The present disclosure relates to a touch or proximity sensing system that determines touch or proximity by detecting a capacitance change between two opposite electrodes of at least one capacitive sensor. The capacitance between the two electrodes of the capacitive sensor is measured by charging and discharging the capacitive sensor, the discharging including transferring charges charged to the capacitive sensor to a sample capacitor. The capacitance is determined based on cycles to charge a voltage difference across the sample capacitor to a predetermined voltage.

Figure 1:
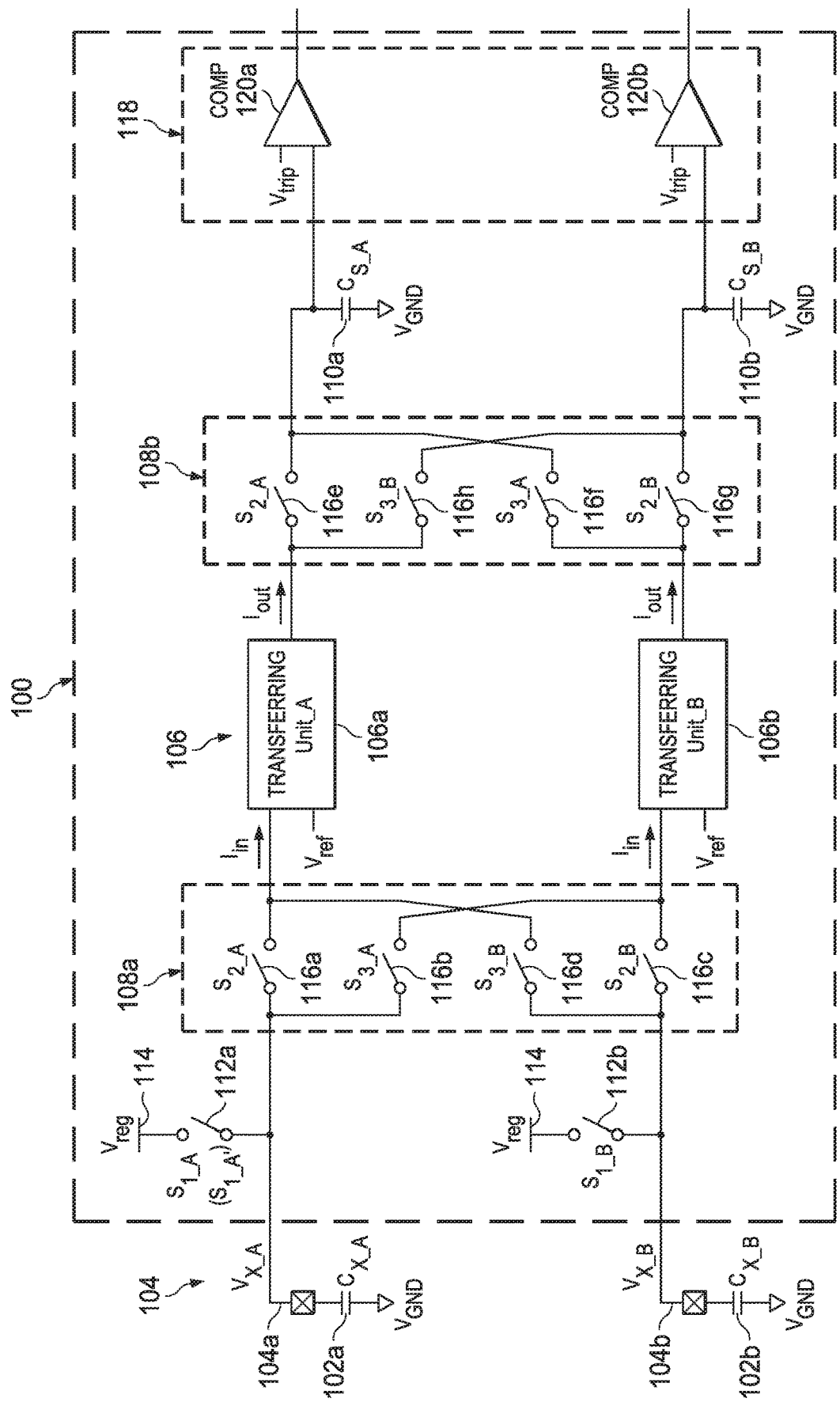
FIG. 1 is a schematic block diagram of a sensing system in accordance with a first embodiment of the present disclosure.

Referring now to FIG. 1, a schematic block diagram of a sensing system 100 for sensing touch or proximity with at least a first capacitive sensor 102a in accordance with a first embodiment of the present disclosure is shown. The first capacitive sensor 102a includes a first end coupled to the sensing system 100 and a second end opposite to the first end coupled to ground. The sensing system 100 is configured to charge a number of charges to the first capacitive sensor 102a through the first end thereof in charging phases of successive cycles, and transfer the charges to a sample capacitor in transferring phases of the successive cycles by discharging the first capacitive sensor 102a, to sense a capacitance change of the first capacitive sensor 102a.

The sensing system 100 includes a first number of input terminals 104 configured to couple to one or more capacitive sensors, such as the first capacitive sensor 102a, and a second number of transferring units 106 configured to transfer the charges from the one or more capacitive sensors through the first number of input terminals 104 in the transferring phases, wherein at least one of the first and second numbers is equal to or greater than two. The sensing system 100 further includes a first switching unit 108a, coupled between the first number of input terminals 104 and the second number of transferring units 106, configured to selectively electrically couple any one of the first number of input terminals 104 to any one of the second number of transferring units 106.

In a preferred embodiment, the first number of input terminals 104 include a first input terminal 104a configured to couple the first capacitive sensor 102a, and the second number of transferring units 106 include first and second transferring units 106a and 106b. In a preferred embodiment, each of the first and second transferring units 106a and 106b is a current mirror. Ina preferred embodiment, the current mirror is a class AB current mirror. The sensing system 100 further includes a second switching unit 108b, coupled to the second number of transferring units 106. In one example, the first and second switching units 108a and 108b are configured to alternately electrically couple one of the first and second transferring units 106a and 106b between the first input terminal 104a and a first sample capacitor 110a in transferring phases of the first capacitive sensor 102a, to transfer charges charged to the first capacitive sensor 102a to the first sample capacitor 110a. The first sample capacitor 110a can either be a part of the sensing system 100 or separate from the sensing system 100. The touch or proximity to the first capacitive sensor 102a is determined based on cycles for charging a voltage difference across the first sample capacitor 110a to a predetermined voltage. In a preferred implementation, the first number of input terminals 104 further includes a second input terminal 104b. In a preferred implementation, the second input terminal 104b is configured to receive charges from a second capacitive sensor 102b. The touch or proximity to the second capacitive sensor 102b is determined in a same or similar manner.

In one example, the sensing system 100 includes first and second charging switches 112a and 112b respectively coupled between a voltage source $V_{reg}$ 114 and the first and second input terminals 104a and 104b respectively configured to charge the first and second capacitive sensors 102a and 102b during charging phases thereof. The first switching unit 108a includes first to fourth transferring switches 116a to 116d coupled between the first number of input terminals 104 and the second number of transferring units 106 for selectively electrically coupling any one of the first and second input terminals 104a and 104b to any one of the first and second transferring units 106a and 106b. The second switching unit 108b includes fifth to eighth transferring switches 116e to 116h coupled between the second number of transferring units 106 and the first and a second sample capacitors 110a and 110b for selectively electrically coupling any one of the second number of transferring units 106 to any one of the first and second sample capacitors 110a and 110b. The first and second charging switches 112a and 112b can be transistors operating between ON and OFF status respectively controlled by corresponding first and second charging signals $S_{1\_A}$ and $S_{1\_B}$, the first to fourth transferring switches 116a to 116d can be transistors operating between ON and OFF status respectively controlled by corresponding first to fourth transferring signals $S_{2\_A}$, $S_{2\_B}$, $S_{3\_A}$ and $S_{3\_B}$, and the fifth to eighth transferring switches 116e to 116h can be transistors operating between ON and OFF status respectively controlled by the first to fourth transferring signals $S_{2\_B}$, $S_{2\_B}$, $S_{3\_A}$ and $S_{3\_B}$. In one implementation, the charging and transferring signals are generated by a signal generator (not shown) based on a clock signal. The relationship between the clock signal and the charging or transferring signals can be configurable by a user through the signal generator.

Taking the first capacitive sensor 102a for example, during operation, the first charging signal $S_{1\_A}$ is asserted in charging phases of successive cycles, and the first and second transferring signals $S_{2\_A}$ and $S_{3\_A}$ alternately asserted in transferring phases of the successive cycles to alternately configure one of the first and second transferring units 106a and 106b to transfer charges from the first capacitive sensor 102a to the first sample capacitor 110a, which averages errors caused by the first and second transferring units 106a and 106b due to, for example, random telegraph signal (RTS) noise, current mirror non-linearity, etc. Therefore, accuracy of capacitance change sensing is improved.

Figure 2:
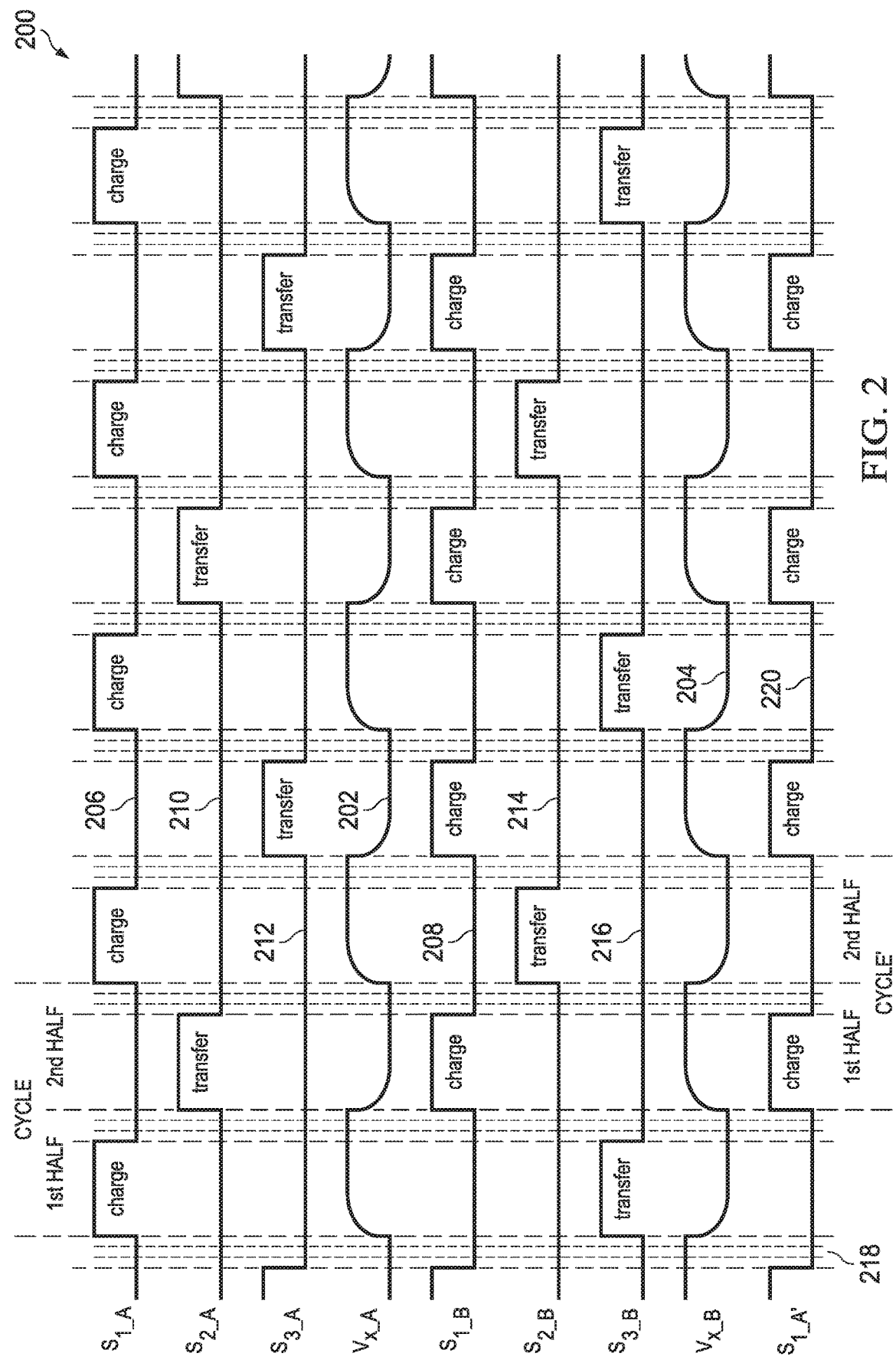
FIG. 2 is a timing diagram illustrating changes of voltage differences across first and second capacitive sensors during operation of the sensing system of FIG. 1 in accordance with an example.

FIG. 2 is a timing diagram 200 illustrating changes of voltages $V_{X\_A}$ and $V_{X\_B}$ at the first and second input terminals 104a and 104b during operation of the sensing system 100 of FIG. 1 in accordance with an example. The timing diagram 200 demonstrates the voltages $V_{X\_A}$ and $V_{X\_B}$ respectively at 202 and 204, the first and second charging signals $S_{1\_A}$ and $S_{1\_B}$ respectively at 206 and 208, and the first to fourth transferring signals $S_{2\_A}$, $S_{3\_A}$, $S_{2\_B}$ and $S_{3\_B}$ respectively at 210 to 216. The first and second charging signals $S_{1\_A}$ and $S_{1\_B}$ configure the first and second capacitive sensors 102a and 102b to be charged respectively in first and second half of each cycle. In an example, the first and second transferring signals $S_{2\_A}$ and $S_{3\_A}$ configure the first and second transferring units 106a and 106b to alternately transfer the charges received at the first input terminal 104a to the first sample capacitor 110a in the second half of each cycle. The third and fourth transferring signals $S_{2\_B}$ and $S_{3\_B}$ configure the first and second transferring units 106a and 106b to alternately transfer the charges received at the second input terminal 104b to the second sample capacitor 110b in the first half of each cycle. In a preferred embodiment, a gap time 218 is provided between charging and transferring to ensure break-before-make switch action.

Referring back to FIG. 1, the sensing system 100 further includes a determining unit 118 coupled to at least the first sample capacitor 110a. In a preferred embodiment, the sensing system 100 performs first and second conversions, in each conversion a voltage difference across the first sample capacitor 110a is charged to a first trip voltage $V_{trip1}$, wherein the charging and transferring phases in the second conversion are half-cycle phase shifted with respect to the corresponding charging and transferring phases in the first conversion, which improves noise immunity of the sensing system 100 against noise injection. The determining unit 118 generates a first signal $N_{1x}$ indicative of a number of the cycles in the first conversion and a second signal $N_{2x}$ indicative of a number of the cycles in the second conversion, wherein the touch or proximity to the first capacitive sensor 102a is determined based on a final count $N_x$ which is a combination of the first and second signals $N_{1x}$ and $N_{2x}$. In one example, the final count $N_x$ is defined in accordance with the equation below:

$$N_x = 2 \cdot N_{1x} \cdot N_{2x} / (N_{1x} + N_{2x}) \qquad (1)$$

The touch or proximity to the second capacitive sensor 102b is determined in a same manner based on two conversions with half-cycle phase shift. In one implementation, the sensing system 100 performs sequential scanning over the first and second capacitive sensors 102a and 102b to determine touch or proximity respectively to the first ends 104a and 104b of the first and second capacitive sensors 102a and 102b in a situation that the first and second capacitive sensors 102a and 102b respectively correspond to first and second buttons.

Referring to FIG. 2, the first charging signal that controls the first charging switch 112a in the second conversion, marked as $S_{1\_A'}$, is demonstrated at 220, which shows half-cycle phase shift with respect to the first charging signal $S_{1\_A}$ 206 in the first conversion. The rest signals are also phase shifted by half cycle in a same manner in the second conversion.

In a preferred embodiment, the determining unit 118 includes a first comparator 120a that compares the voltage difference across the first sample capacitor 110a with the first trip voltage $V_{trip1}$, and a first counter (not shown) coupled to the first comparator 120a. The first counter counts the cycles in each of the first and second conversions and respectively generates the first and second signals $N_{1x}$ and $N_{2x}$ when the voltage difference across the first sample capacitor 110a reaches the first trip voltage $V_{trip1}$ in each of the first and second conversions. In a preferred embodiment, the first sample capacitor 110a is coupled between an input terminal of the first comparator 120a and ground, therefore a voltage difference across the first sample capacitor 120a is determined by determining a voltage at the input terminal of the first comparator 120a. Similarly, the determining unit 118 further includes a second comparator 120b that compares the voltage difference across the second sample capacitor 110b with $V_{trip2}$ and a second counter (not shown) coupled to the second comparator 120b. In a preferred embodiment, the first and second trip voltages $V_{trip1}$ and $V_{trip2}$ are equal to a same trip voltage $V_{trip}$.

Figure 3A:
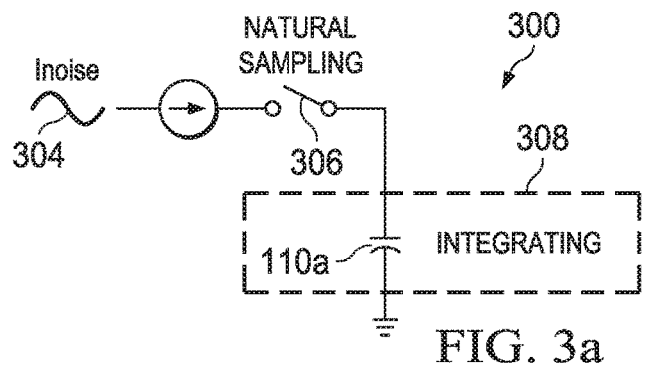
FIGS. 3a and 3b are respective schematic circuit and block diagrams modeling how an input noise affects the sensing system of FIG. 1.
Figure 3B:
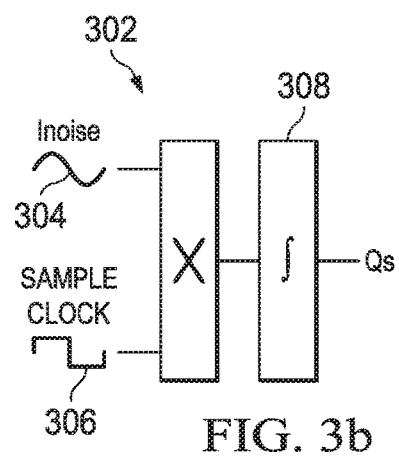

The noise injection from electrode to system can be modeled as those in FIGS. 3a and 3b, which respectively are simplified equivalent schematic circuit and block diagrams 300 and 302 modeling how an input noise 304 injected through the first input terminal 104a affects the sensing system 100 of FIG. 1. The noise injection can be extracted as a natural sampling process plus an integrating process. The input noise 304 represented by a sine signal can be regarded as an additional current source Inoise, and is injected to the sensing system 100 with the touch or proximity to the first sensor capacitor 102a in the transferring phases. The input noise is sampled by a sample clock 306, e.g. the first transferring signal S2_A, and conveyed to and integrated by an integrator 308, e.g. the first sample capacitor 110a. Qs is the noise charge injects to system. The integrator 308 can be regarded as a low pass filter, thus only low frequency components of the input noise matter.

Figure 4:
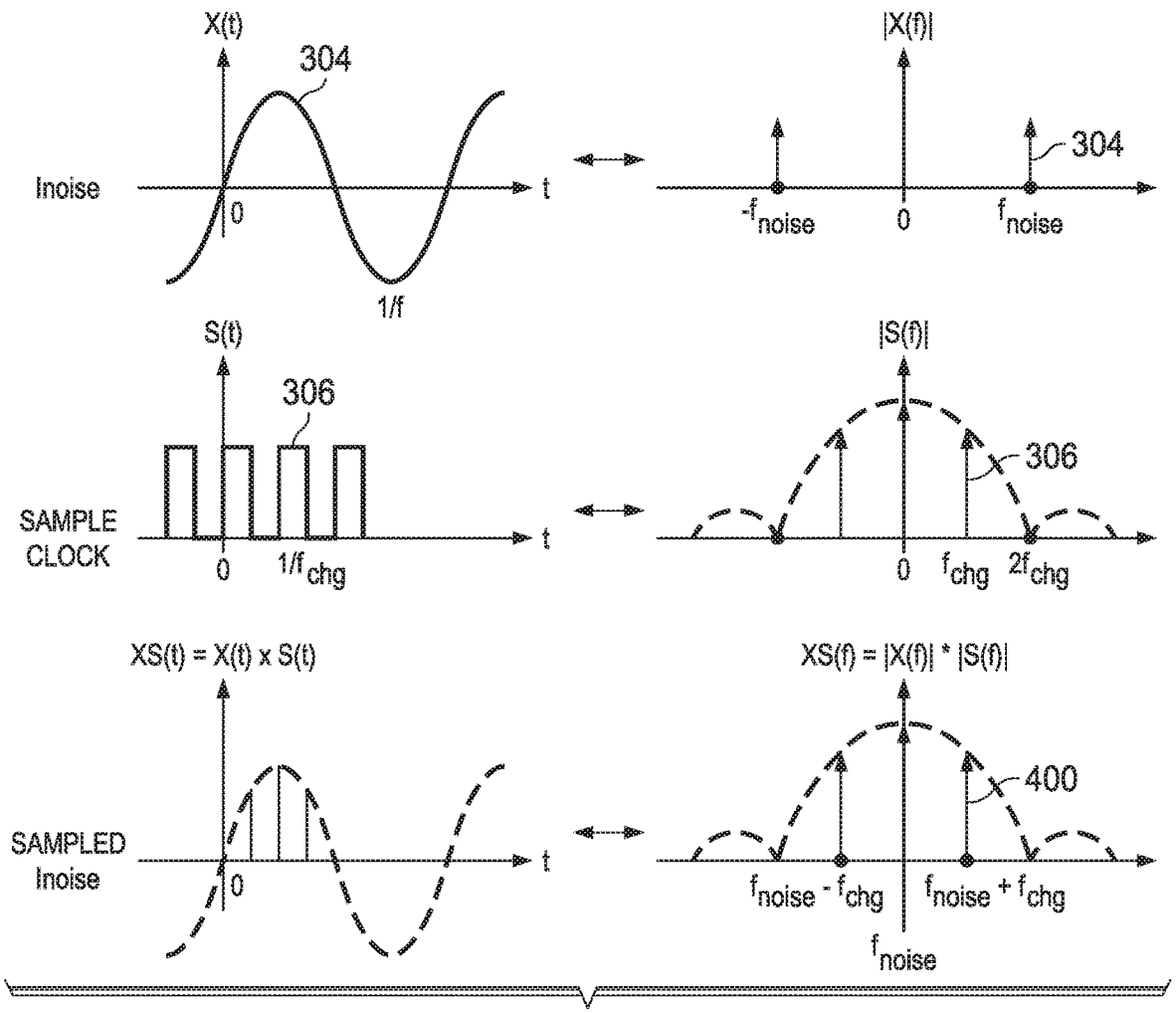
FIG. 4 illustrates sampling the input noise with the sample clock of FIGS. 3a and 3b in time and frequency domains.

FIG. 4 illustrates sampling the input noise 304 with the sample clock 306 of FIGS. 3a and 3b in time and frequency domains. In the time domain, the input noise Inoise 304 is represented by a quasi-sine signal x(t) with a frequency $f_{noise}$ in time domain and by X(f) in frequency domain, and the sample clock 306 is represented by a square wave signal s(t) with a frequency $f_{chg}$ in time domain and by S(f) in frequency domain. The sine waveform of the input noise Inoise 304 with certain distortions due to the resistance of the first transferring unit 106a and the controller 108 are not linear, and a maximum current of the input noise Inoise 304 is limited. A sampled Inoise 400 is represented by xs(t) in time domain and by XS(f) in frequency domain. As the example shown in FIG. 4, the sampled Inoise is formed by multiplication of the input noise Inoise and sample clock in time domain and convolution of the input noise Inoise and sample clock in frequency domain.

In an example, in frequency domain, the frequency $f_{noise}$ of the input noise Inoise may range from 150 kHz to 80 MHz, and the frequency $f_{chg}$ of the sample clock usually ranges from 4 kHz to 4 MHz, and in some situations, both are greater than 100 kHz. Therefore, only $f_{noise}-n \cdot f_{chg}$ frequency components of the input noise Inoise matter, where n is a natural number. In addition, if the duty cycle of the sample clock is about 50%, impact of the frequency components of the input noise Inoise with frequencies equal to even harmonics of the frequency $f_{chg}$ of the sample clock is null.

In time domain, the input noise Inoise represented by x(t) is defined in accordance with the equation below:

$$x(t) = A \sin(\omega t) \qquad (2)$$

wherein $\omega = 2\pi f_{noise}$.

s(t) can be represented by Fourier Series as the equation below:

$$s(t) = C_0 + \sum_{n=1}^{\infty} 2C_n \cos(n\omega_s t) \qquad (3)$$

wherein $C_0 = \dfrac{T}{T_s}$ and $C_n = f_s \tau \mathrm{sinc}(\pi n f_s \tau)$, $\omega_s = 2\pi f_{chg}$.

If the duty cycle of the sample clock is 50%, $\tau = 0.5$ Ts. Therefore, $C_0 = \frac{1}{2}$ and $Cn = 0.5 \sin c(n\pi/2)$. Hence, the sampled Inoise xs(t) is:

$$xs(t) = x(t) \cdot s(t) = A\sin(\omega t) \left[ \frac{1}{2} + \sum_{m=1}^{\infty} \mathrm{sinc}\left(\frac{n\pi}{2}\right) \cdot \cos(n\omega_s t) \right] \qquad (4)$$

In Equation (4), frequency components of interest are:

$$\omega - \omega_s : \frac{1}{2} A \mathrm{sinc}\left(\frac{\pi}{2}\right) \sin(\omega - \omega_s)t = \frac{A}{\pi} \sin(\omega - \omega_s)t, \text{ and}$$

$$\omega - 3\omega_s : \frac{1}{2} A \mathrm{sinc}\left(\frac{3\pi}{2}\right) \sin(\omega - 3\omega_s)t = -\frac{A}{3\pi} \sin(\omega - 3\omega_s)t.$$

If delay s(t) by 180° in phase, $$s\left(t + \frac{T_s}{2}\right) = C_0 + \sum_{n=1}^{\infty} 2C_n \cos(n\omega_s t + \pi \cdot n) \qquad (5)$$

Hence, the delayed sampled Inoise is:

$$xs'(t) = x(t) \cdot s\left(t + \frac{T_s}{2}\right) \qquad (6)$$

In Equation (6), frequency components of interest are:

$$\omega - \omega_s : \frac{1}{2}A\mathrm{sinc}\left(\frac{\pi}{2}\right)\sin(\omega - \omega_s)t = \frac{A}{\pi}\sin(\omega - \omega_s)t, \text{ and}$$

$$\omega - 3\omega_s : \frac{1}{2}A\mathrm{sinc}\left(\frac{3\pi}{2}\right)\sin(\omega - 3\omega_s)t = -\frac{A}{3\pi}\sin(\omega - 3\omega_s)t.$$

From the deduction above, it is proved that s (t) and s (t+T$_s$/2) have opposite magnitude for those frequency components of interests, thus the impact of the input noise in the two situations can be cancelled by each other.

Figure 5:
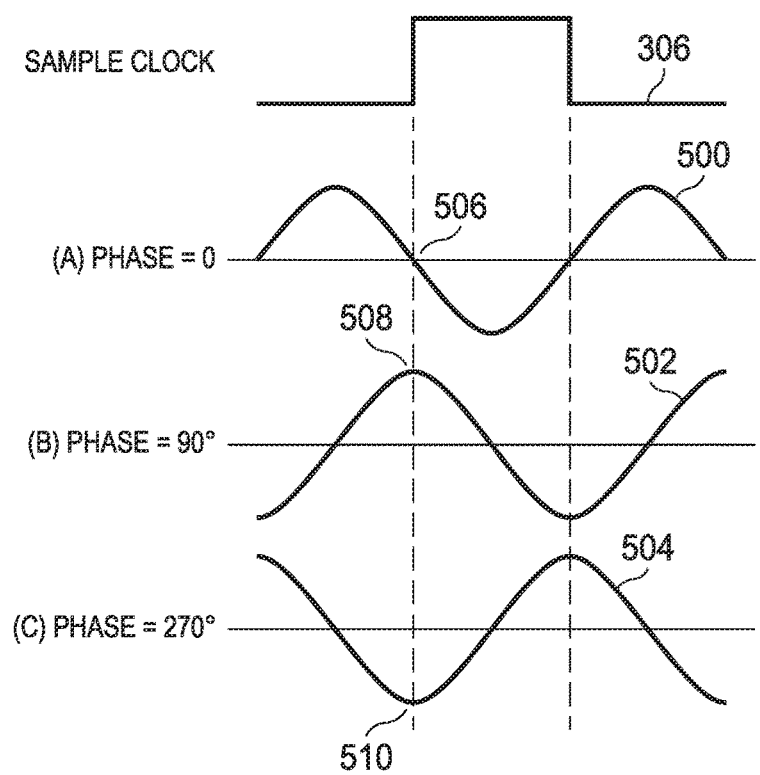
FIG. 5 illustrates the sample clock with different phase shifts with respect to the input noise in time domain.

FIG. 5 is a waveform diagram showing the sample clock 306 and the input noise 304 of FIG. 3 under different phase shifts with each other. In one example, the frequency $f_{chg}$ of the sample clock 306 and frequency $f_{noise}$ of the input noise Inoise 304 are equal, and little or no distortion is caused by the resistance of the first transferring unit 106a and the controller 108. The input noises Inoise with different phase shifts with reference to the sample clock 306 are demonstrated at 500 to 504.

In (a) where the sample clock 306 and input noise Inoise 500 are in the same phase, the sampled Inoise 506 is zero. In (b) where the phase shift between the sample clock 306 and input noise Inoise 502 is 90°, the sampled Inoise 508 is positive. In (c) where the phase shift between the sample clock 306 and input noise Inoise 504 is 270°, the sampled Inoise is negative. The sampled Inoise 508 and 510 in (b) and (c) are same in magnitude but with opposite direction.

Figure 6:
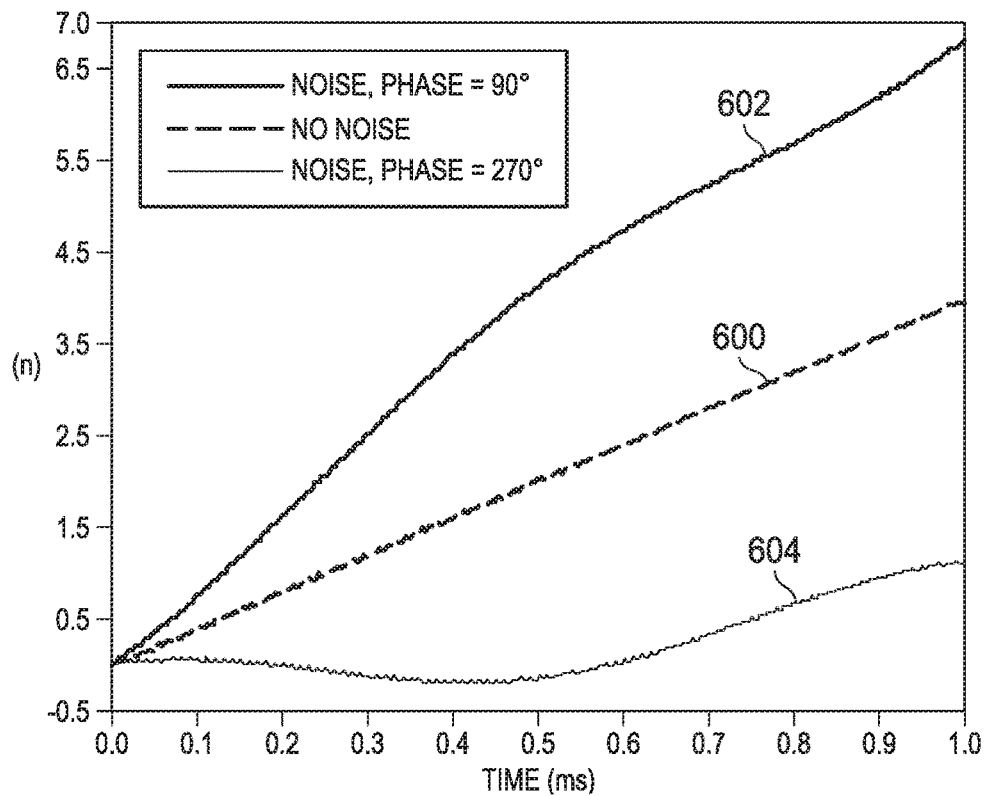
FIG. 6 is a simulation diagram illustrating input current of the transferring unit affected by the input noise with different phase shifts with respect to the sample clock.

FIG. 6 is a simulation diagram illustrating how the input noise with different phase shift affects an input charge of the first transferring unit 106a. The input charge with no affect from the input noise, and the input charge affected by input noises of (b) and (c) of FIG. 5 are respectively demonstrated at 600 to 604. The input noise follows IEC 61000-4-6 level 3 standards.

Both the mathematical derivation and simulation show that the impact of the input noise can be reduced and/or eliminated by performing two conversions with sample clock shifted by half cycle.

In a preferred embodiment, the determining unit 118 is also coupled to a second sample capacitor 110b and determines the touch or proximity to the second capacitive sensor 102b in a same way as determining the touch or proximity to the first capacitive sensor 102a.

Referring back to FIG. 1, different from sequential scanning configuration, in which the touch or proximity is determined based on capacitance change of a single capacitive sensor that correspond to a single button, the sensing system 100 can also be operated in parallel scanning configuration, the touch or proximity is determined based on capacitance changes of both the first and second capacitive sensors 102a and 102b that correspond to a single button.

The determining unit 118 generates a first signal $N_A$ indicative of a number of the cycles for charging a voltage difference across the first sample capacitor 110a to the first trip voltage $V_{trip1}$, and a second signal $N_B$ indicative of a number of the cycles for charging a voltage difference across the second sample capacitor 110b to a second trip voltage $V_{trip2}$. In a preferred embodiment, the first and second trip voltages $V_{trip1}$ and $V_{trip2}$ are equal to a same trip voltage $V_{trip}$. The touch or proximity to both the first and second capacitive sensors 102a and 102b is determined based on a final count N, which is a combination of the first and second signals $N_A$ and $N_B$. In one example, the final count N is defined in accordance with the equation below:

$$N=2*N_A*N_B/(N_A+N_B) \qquad (7)$$

Referring back to FIG. 2, because the charging and transferring cycles of the second capacitive sensor 102b is half-cycle phase shifted with respect to the cycles of the first capacitive sensor 102a. As discussed above, the impact of the input noise is reduced and/or eliminated.

Figure 7:
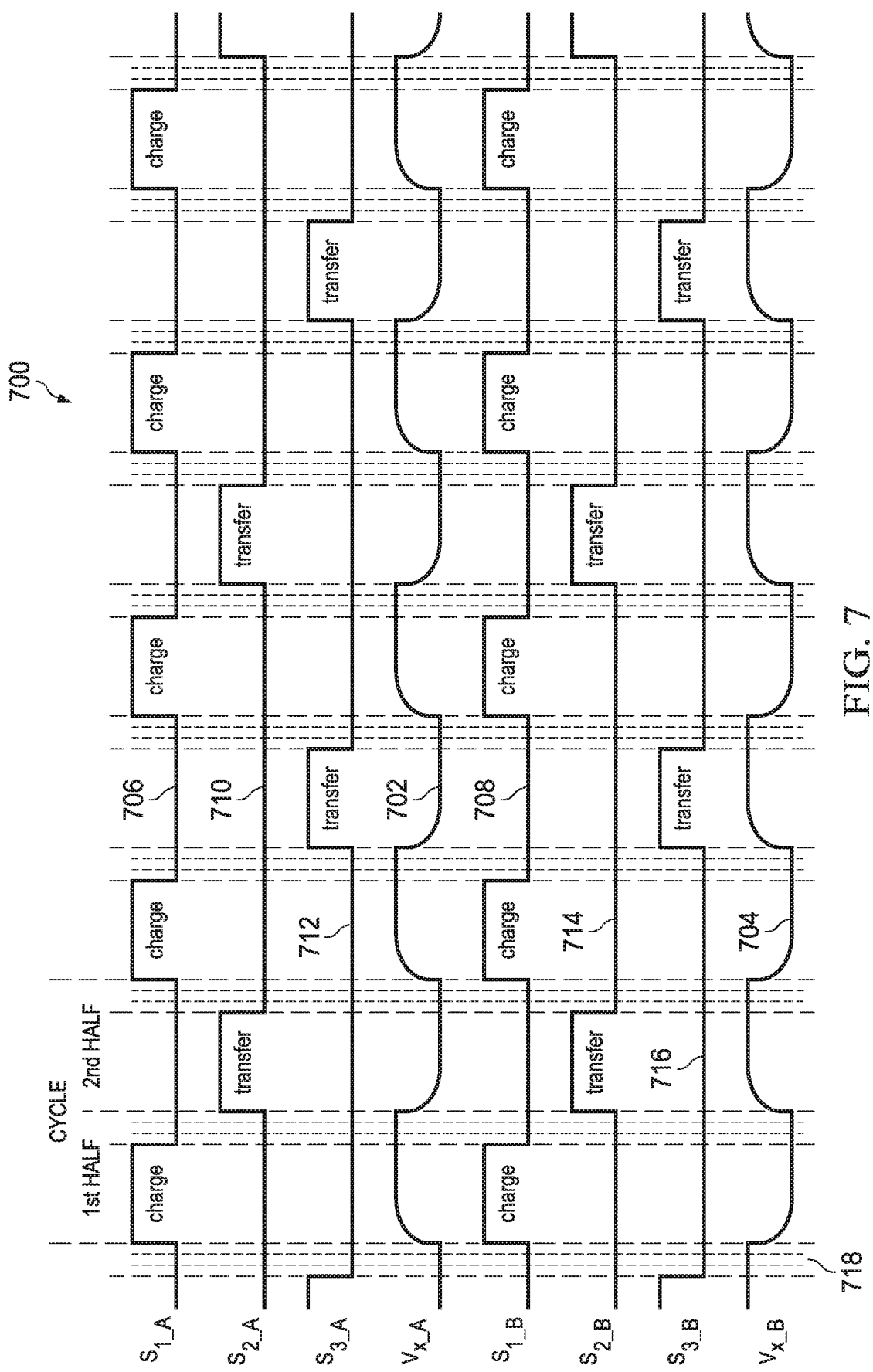
FIG. 7 is a timing diagram illustrating changes of voltage differences across the first and second capacitive sensors during operation of the sensing system of FIG. 1 in accordance with another example.

FIG. 7 is a timing diagram 700 demonstrating changes of the voltages $V_{X\_A}$ and $V_{X\_B}$ at the first and second input terminals 104a and 104b during operation of the sensing system 100 of FIG. 1 in accordance with another example.

The timing diagram 700 demonstrates the voltages $V_{X\_A}$ and $V_{X\_B}$ respectively at 702 and 704, the first and second charging signals $S_{1\_A}$ and $S_{1\_B}$ respectively at 706 and 708, and the first to fourth transferring signals $S_{2\_A}$, $S_{3\_A}$, $S_{2\_B}$ and $S_{3\_B}$ respectively at 710 to 716. Different from the timing diagram 200 of FIG. 200, the first and second charging signals $S_{1\_A}$ and $S_{1\_B}$ are synced, the first and third transferring signals $S_{2\_A}$ and $S_{2\_B}$ are synced and the second and fourth transferring signals $S_{3\_A}$ and $S_{3\_B}$ are synced and alternated with the first and third transferring signals $S_{2\_A}$ and $S_{2\_B}$. In a preferred embodiment, a gap time 718 is provided between charging and transferring to ensure break-before-make switch action.

Figure 8:
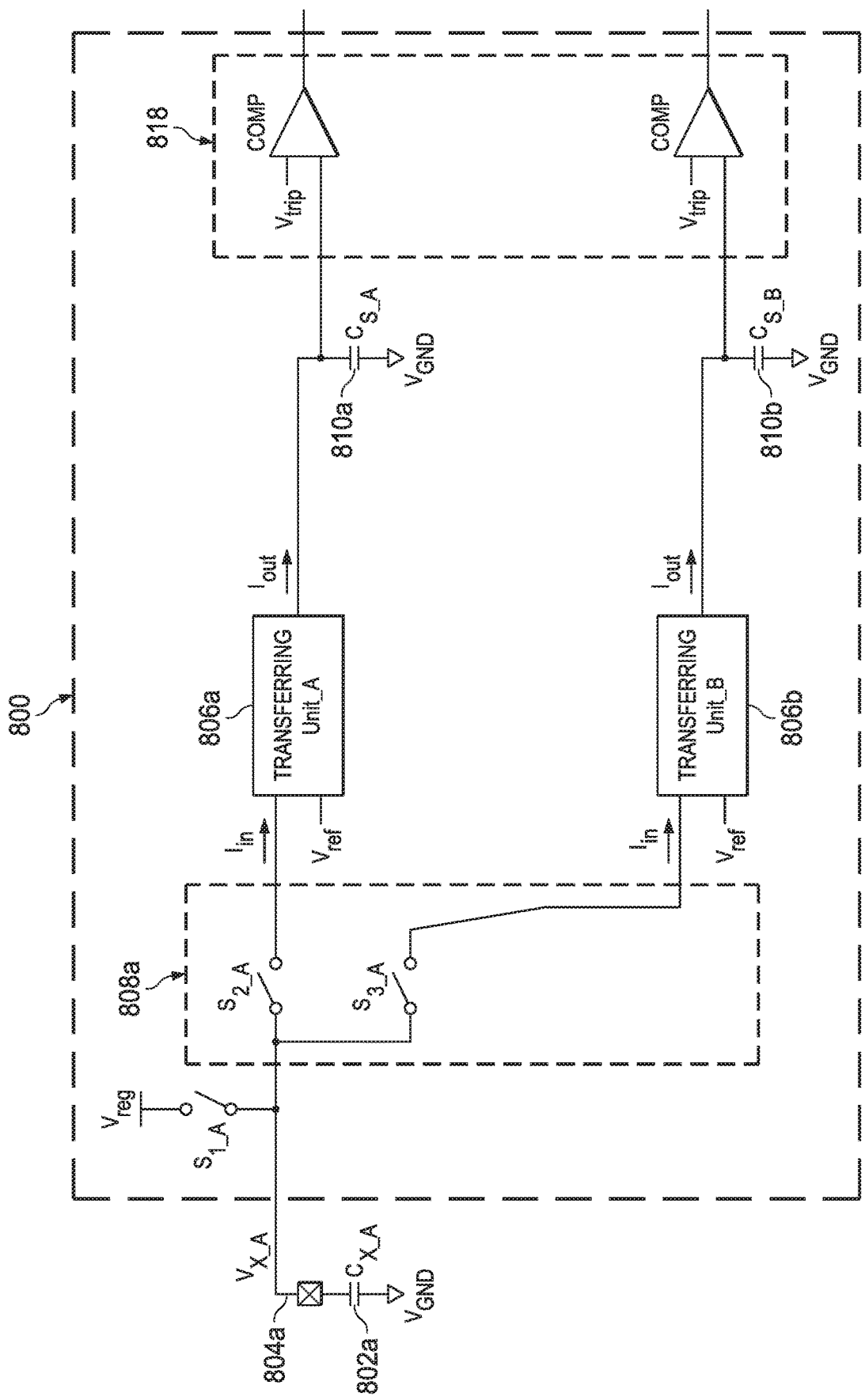
FIG. 8 is a schematic block diagram of a sensing system in accordance with a second embodiment of the present disclosure.

FIG. 8 is a schematic block diagram of a sensing system 800 in accordance with a second embodiment of the present disclosure.

The system 800 is substantially similar to the system 100 of FIG. 1, except that the first and second transferring units 806a and 806b are respectively directly coupled to the first and second sample capacitors 910a and 910b, and the first switching unit 808a is configured to alternately electrically couple one of the first and second transferring units 806a and 806b to the first input terminal 804a. In a preferred embodiment, each of the first and second transferring units 806a and 806b is a current mirror. In a preferred embodiment, the current mirror is a class AB current mirror. In a preferred embodiment, the determining unit 818 generates a first signal $N_1$ indicative of a number of the cycles for charging a voltage difference across the first sample capacitor 810a to a first trip voltage $V_{trip1}$ in the first conversion, a second signal $N_2$ indicative of a number of the cycles for charging a voltage difference across the second sample capacitor to a second trip voltage $V_{trip2}$. In a preferred embodiment, the first and second trip voltages $V_{trip1}$ and $V_{trip2}$ are equal to a same trip voltage $V_{trip}$. The touch or proximity to the capacitive sensor 802a is determined based on a final count N, which is a combination of the first and second signals $N_1$ and $N_2$. In one example, the final count N is defined in accordance with the equation below:

$$N=(N_1+N_2)/2 \qquad (8)$$

In addition, as discussed above, the sensing system 800 can be configured to perform two conversions with half-cycle phase shifted to eliminate the impact of the input noise.

Figure 9:
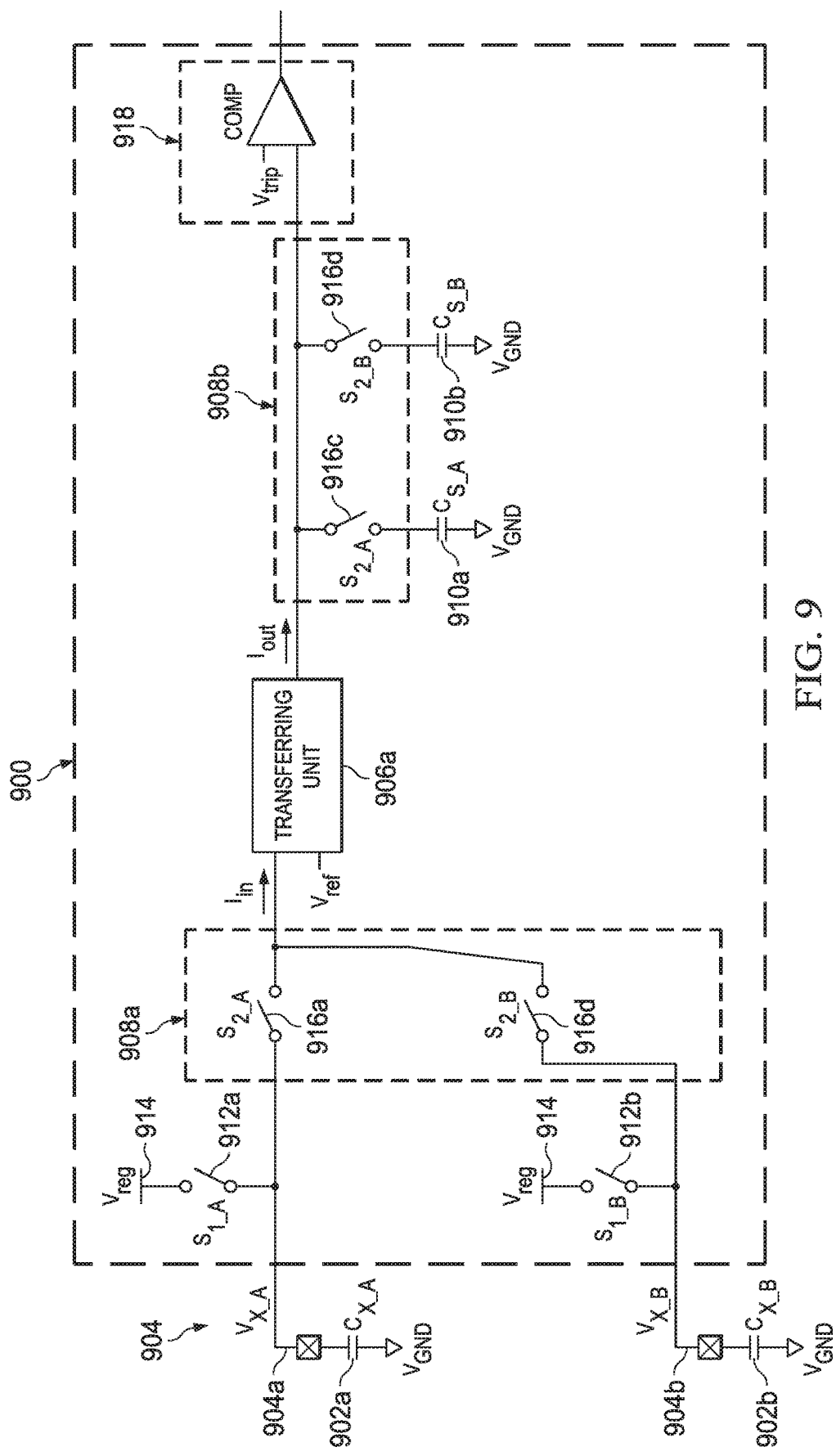
FIG. 9 is a schematic block diagram of a sensing system in accordance with a third embodiment of the present disclosure.

Referring to FIG. 9, a schematic block diagram of a sensing system 900 for sensing touch or proximity to first and second capacitive sensors 902a and 902b in accordance with a third embodiment of the present disclosure is shown. The sensing system 900 is substantially similar to the sensing system 100 of FIG. 1, except that the configuration supports 2 IOs with only 1 transferring unit. The sensing system 900 includes first and second input terminals 904a and 904b for receiving charges respectively from the first and second capacitive sensors 902a and 902b, and a transferring unit 906a for transferring the charges received at the first and second input terminals 904a and 904b. In a preferred embodiment, the transferring units 906a is a current mirror. In a preferred embodiment, the current mirror is a class AB current mirror. The sensing system 900 also includes first and second switching units 908a and 908b configured to electrically couple the transferring unit 906a alternately between the first input terminal 902a and a first sample capacitor 910a, and between the second input terminal 904b and a second sample capacitor 910b.

In a preferred embodiment, the sensing system 900 includes first and second charging switches 912a and 912b respectively coupled between a voltage source $V_{reg}$ 914 and the first and second input terminals 904a and 904b. The first switching unit 908a includes first and second transferring switches 916a and 916b respectively coupled between the first and second input terminals 904a and 904b and the transferring unit 906a, and the second switching unit 908b includes third and fourth transferring switches 916c and 916d respectively coupled between the transferring unit 906a and the first and second sample capacitors 910a and 910b. The first and second charging switches 912a and 912b can be transistors operating between ON and OFF status respectively controlled by corresponding first and second charging signals $S_{1\_A}$ and $S_{1\_B}$, the first and third transferring switches 916a and 916c can be transistors operating between ON and OFF status controlled by a first transferring signal $S_{2\_A}$, and the second and fourth transferring switches 916b and 916d can be transistors operating between ON and OFF status controlled by a second transferring signal $S_{2\_B}$.

Figure 10:
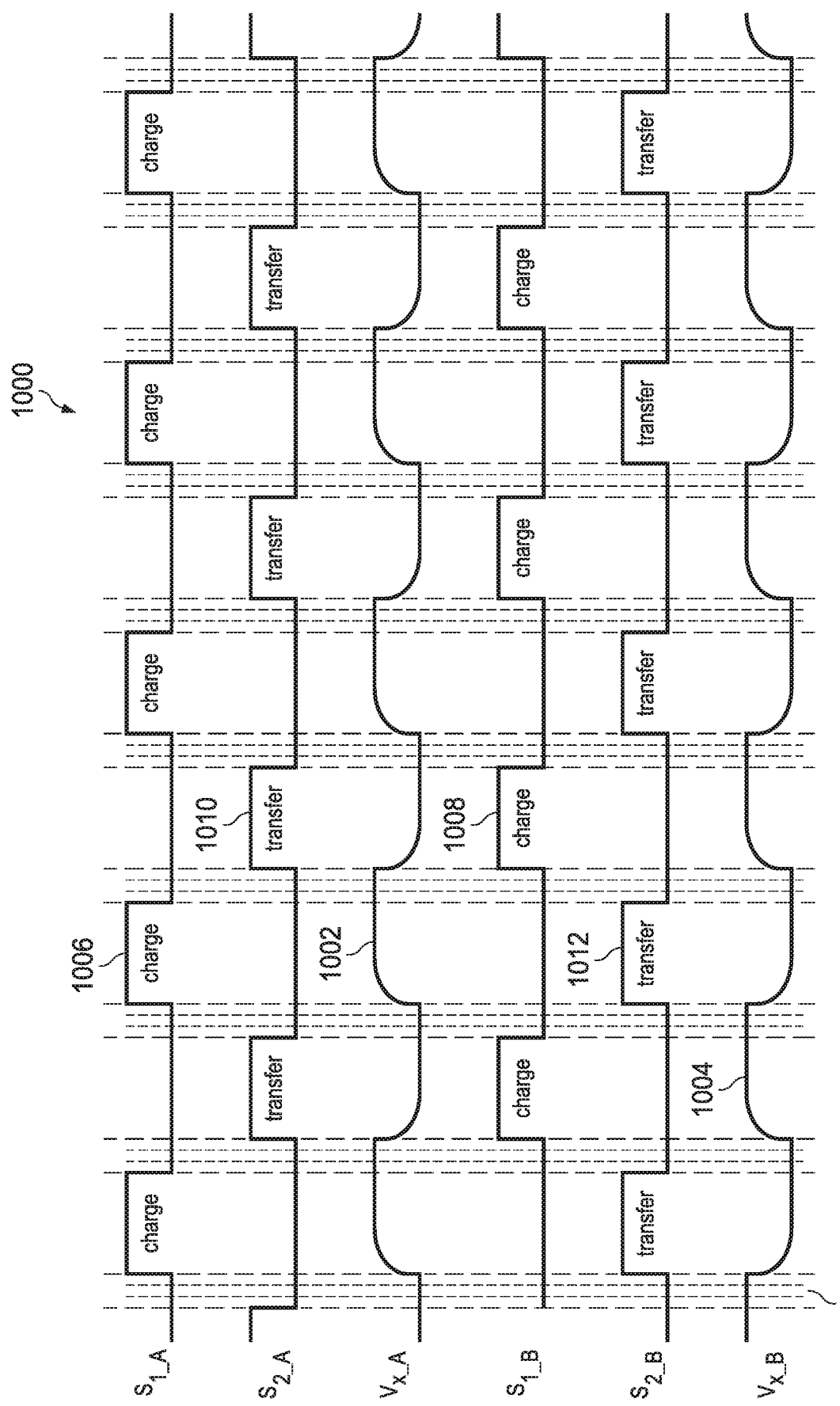
FIG. 10 is a timing diagram illustrating changes of voltage differences across first and second capacitive sensors during operation of the sensing system of FIG. 9 in accordance with an example.

FIG. 10 is a timing diagram 1000 demonstrating changes of voltages $V_{X\_A}$ and $V_{X\_B}$ at the first and second input terminals 904a and 904b during operation of the sensing system 900 of FIG. 9 in accordance with an example.

The timing diagram 1200 demonstrates the voltages $V_{X\_A}$ and $V_{X\_B}$ at the first and second input terminals 904a and 904b of the sensing system 900 respectively at 1002 and 1004, the first and second charging signals $S_{1\_A}$ and $S_{1\_B}$ respectively at 1006 and 1008, and the first and second transferring signals $S_{2\_A}$ and $S_{2\_B}$ respectively at 1010 and 1012. In an example, the first and second charging signals $S_{1\_A}$ and $S_{1\_B}$ configure the first and second capacitive sensors 902a and 902b to be charged respectively in first and second half of each cycle. The first transferring signal $S_{2\_A}$ configures the transferring unit 906a to transfer the charges from the first input terminal 904a to the first sample capacitor 910a in the second half of each cycle, and the second transferring signal $S_{2\_B}$ configures the transferring unit 906a to transfer the charges from the second input terminal 904b to the second sample capacitor 910b in the first half of each cycle. In a preferred embodiment, a gap time 1014 is provided between charging and transferring to ensure break-before-make switch action.

Similarly, as discussed above, touch or proximity to each of the first and second capacitive sensors 902a and 902b can be determined based on two conversions with half-cycle phase shifted to eliminate the impact of the input noise, and similarly, as discussed above, with parallel scanning configuration, the sensing system 900 can be configured to detect one touch or proximity based on capacitance changes of both the first and second capacitive sensors 902a and 902b.

Figure 11:
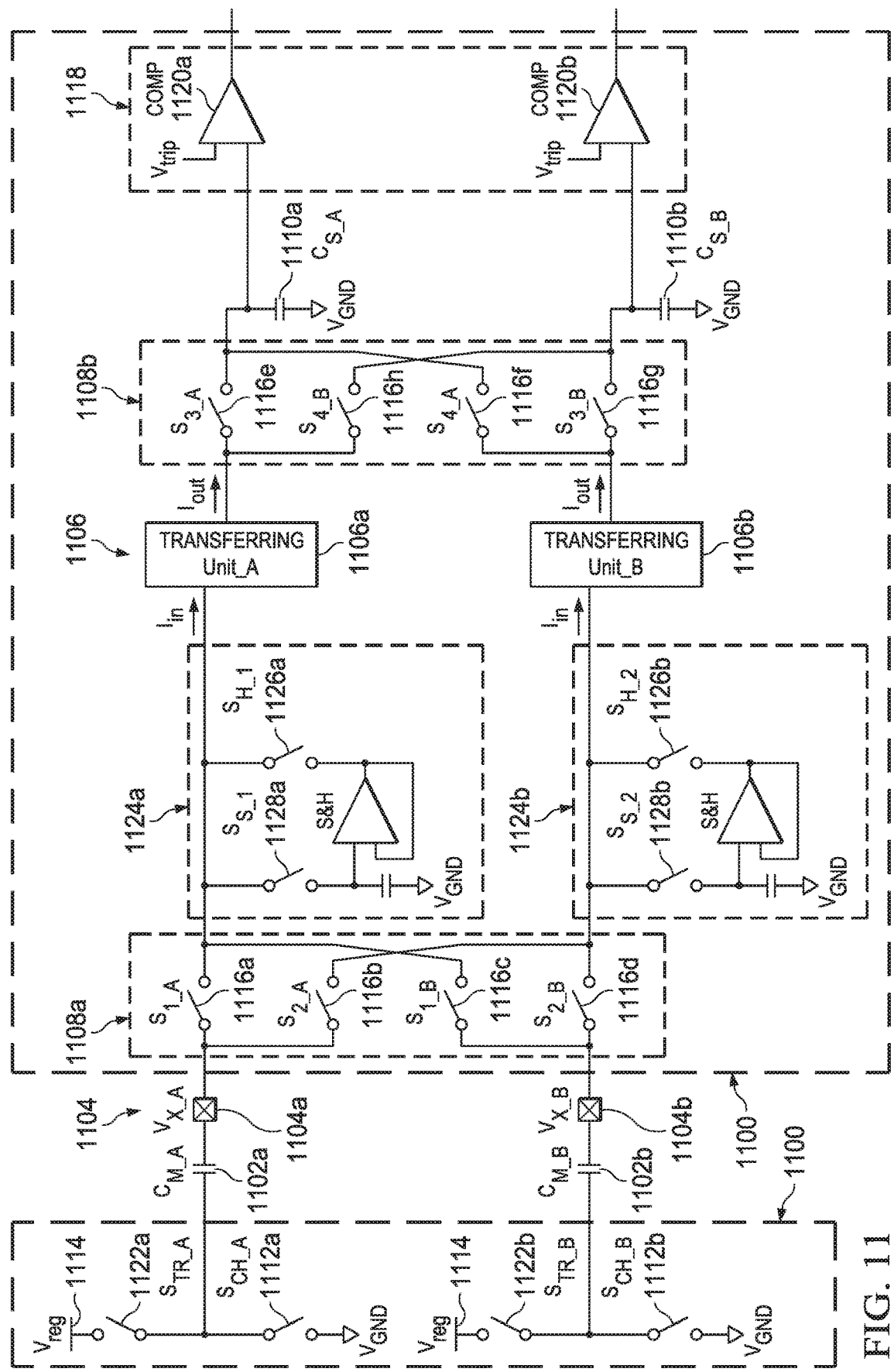
FIG. 11 is a schematic block diagram of a sensing system in accordance with a fourth embodiment of the present disclosure.

FIG. 11 is a schematic block diagram of a sensing system 1100 in accordance with a fourth embodiment of the present disclosure. The sensing system 1100 is substantially similar to the system 100 of FIG. 1, except that the system 1100 senses the changes of the capacitance of the first and second capacitive sensors 1102a and 1102b based on a mutual capacitance sensing mode, while the sensing system 100 of FIG. 1 senses the changes of the capacitance of the first and second capacitive sensors 102a and 102b based on a self-capacitance sensing mode. In the self-capacitance sensing mode, a first end of a capacitive sensor is coupled to a voltage source $V_{reg}$ in charging phases and to a transferring unit in transferring phases, and an opposite second end of the capacitive sensor is coupled to ground. In the mutual capacitance sensing mode, a first end of a capacitive sensor is coupled to a transferring unit, and an opposite second end is coupled to ground in charging phases and to a voltage source $V_{reg}$ in transferring phases.

As shown in FIG. 11, a first end of the first capacitive sensor 1102a is coupled to the first input terminal 1104a of the system 1100. The system 1100 further includes a first charging switch 1112a coupled between an opposite second end of the first capacitive sensor 1102a and ground $V_{GND}$, and a first pumping switch 1122a coupled between the second end of the first capacitive sensor 1302a and a voltage source $V_{reg}$ 1114, wherein the first charging switch 1112a and the first pumping switch 1122a are reciprocally switched on and off to hold a voltage $V_{X\_A}$ of the first input terminal 1104a at a first predetermined voltage $V_{tn}$ in charging phases and pumping the voltage $V_{X\_A}$ at the first input terminal 1104a to a second predetermined voltage in transferring phases. The second predetermined voltage is proportional to a combination of the first predetermined voltage and the voltage source $V_{reg}$.

The system 1100 further includes a first holding and sampling unit 1124a coupled between the first input terminal 1104a and an input terminal of the first transferring unit 1106a, and a second holding and sampling unit 1124b coupled between the second input terminal 1104b and an input terminal of the second transferring unit 1106b. Each of the first and second holding and sampling units 1124a and 1124b is configured to sample a bias voltage at the input terminal of the corresponding first or second transferring unit 1306a or 1306b in the transferring phases, wherein the first predetermined voltage $V_{tn}$ is based on the bias voltage, and hold the first predetermined voltage $V_{tn}$ in the charging phases. In a preferred embodiment, each of the first and second transferring units 1106a and 1106b is a current mirror. In a preferred embodiment, the current mirror is a class AB current mirror. The bias voltage $V_{tn}$ is generated by a bias current proportional to a reference voltage $V_{ref}$.

The system 1100 also includes a first switching unit 1108a coupled between the first input terminal 1104a and the first and second holding and sampling units 1124a and 1124b, and a second switching unit 1108b. The first switching unit 1108a is configured to selectively electrically couple the first input terminal 1104a to one of the first and second holding and sampling units 1124a and 1124b in the charging phases to hold the voltage $V_{X\_A}$ at the first predetermined voltage $V_{tn}$. In the transferring phases, similar to the sensing system 100 of FIG. 1, the first and second switching units 1108a and 1108b are configured to alternately electrically couple one of the first and second transferring units 1106a and 1106b between the first input terminal 1104a and a first sample capacitor 1110a to determine the touch or proximity to the first capacitive sensor 1102a. The touch or proximity to the first capacitive sensor 1102a is determined by the determining unit 1118 in a same manner as the touch or proximity to the first capacitive sensor 102a determined by the determining unit 118 of the system 100 of FIG. 1, or the touch or proximity to the capacitive sensor 802a determined by the determining unit 818 of the system 800 of FIG. 8.

In a preferred embodiment, each of the first and second holding and sampling units 1124a and 1124b includes a holding switch 1326a/1326b and a sampling switch 1328a/1328b. The sampling and holding switches can be transistors operating between ON and OFF status respectively controlled by corresponding holding and sampling signals $S_{H\_1}$, $S_{S\_1}$, $S_{H\_2}$, $S_{S\_2}$ generated by the sensing system 1100. The first charging switch 1112a and the first pumping switch 1122a can also be transistors operating between ON and OFF status respectively controlled by corresponding first charging signal $S_{CH\_A}$ and transferring signal $S_{TR\_A}$ generated by the sensing system 1100.

In a preferred embodiment, the touch or proximity to a second capacitive sensor 1102b coupled to a second input terminal 1104b of the system 1100 is determined in a same manner by alternately configuring one of the first and second holding and sampling units 1124a and 1124b to hold the voltage $V_{X\_B}$ at the second input terminal 11304b at the first predetermined voltage $V_m$ in the charging phases and reciprocally electrically coupling one of the first and second transferring units 1306a and 1306b between the second input terminal 1104b and a second sample capacitor 1110b. In a preferred embodiment, the charging phases of the second capacitive sensor 1302b are synchronized with the charging phases of the first capacitive sensor 1302a. In another preferred embodiment, the charging phases of the second capacitive sensor 1302b are half-cycle phase shifted with reference to the charging phases of the first capacitive sensor 1302a.

Similar to the first and second switching units 118a and 118b of the system 100 of FIG. 1, the first switching unit 1118a includes first to fourth coupling switches 1116a to 1116d coupled between the first number of input terminals 1104 and the second number of transferring units 1106, configured to selectively electrically couple any one of the first and second input terminals 1104a and 1104b to any one of the first and second transferring units 1106a and 1106b. The second switching unit 1118b includes and fifth to eighth coupling switches 1116e to 1116h coupled between the second number of transferring units 1106 and first and second sample capacitors 1110a and 1110b. The first to fourth coupling switches 1116a to 1116d can be transistors operating between ON and OFF status respectively controlled by corresponding first to fourth coupling signals $S_{1\_A}$, $S_{2\_A}$, $S_{1\_B}$ and $S_{2\_B}$ generated by the sensing system 1100, and the fifth to eighth coupling switches 1116e to 1116h can be transistors operating between ON and OFF status respectively controlled by corresponding first to fourth coupling signals $S_{3\_A}$, $S_{1\_A}$, $S_{3\_B}$ and $S_{4\_B}$ generated by the sensing system 1100. The determining unit 1118 determines touch or proximity to the first and/or second capacitive sensors 1102a and 1102b in a same manner as the determining unit 118 of the sensing system 100 of FIG. 1. Alternately configuring one of the first and second transferring units 1106a and 1106b to transfer the charges from each of the first and second capacitive sensor 1102a and 1102b averages distortion caused by each of the first and second transferring units 1106a and 1106b, thereby improving the accuracy of capacitance change sensing. In addition, as discussed above, the sensing system 1100 can be configured to perform two conversions with half-cycle phase shifted to eliminate the impact of the input noise.

Figure 12:
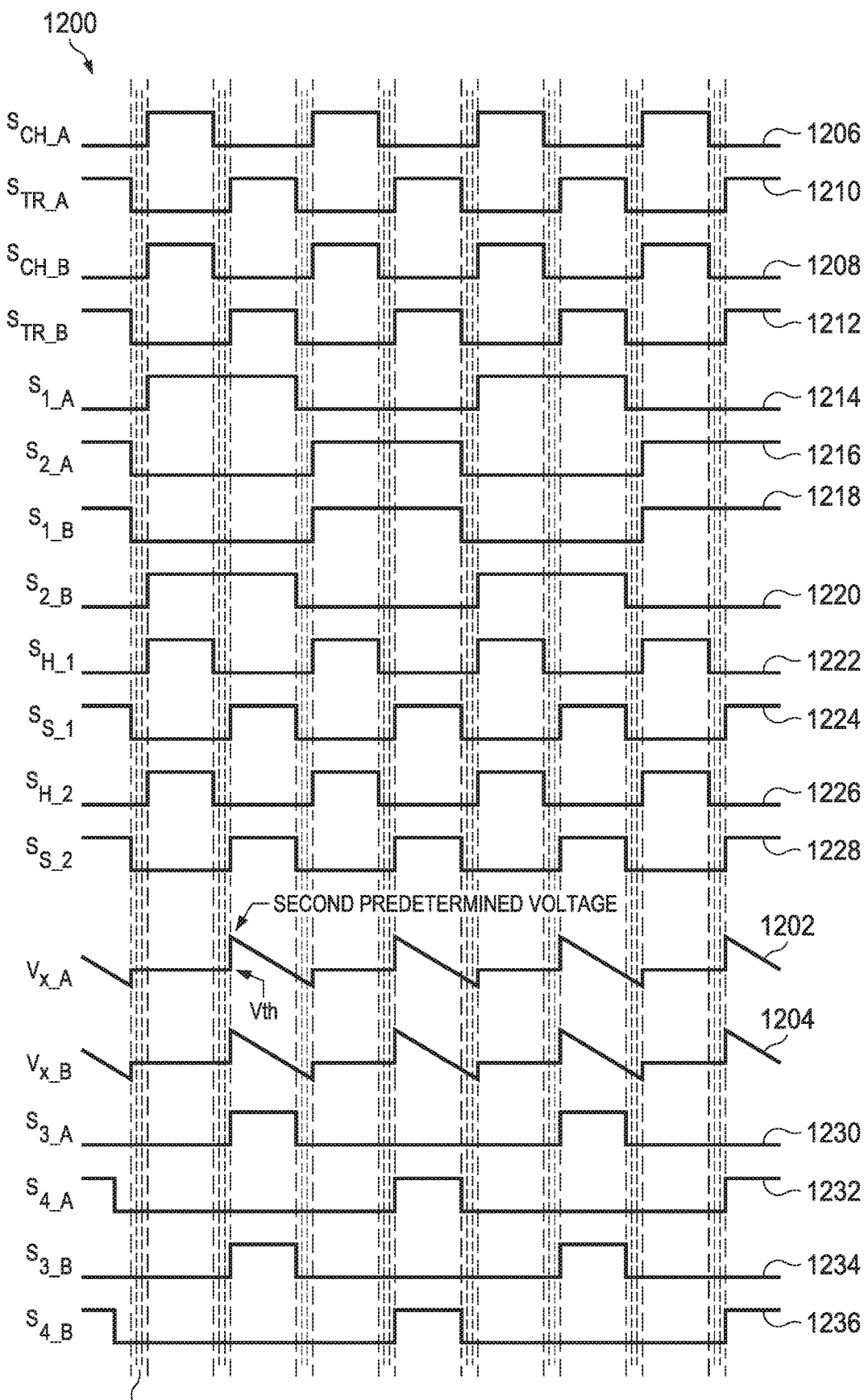
FIG. 12 is a timing diagram illustrating changes of voltages at the first and second input terminals of the sensing system of FIG. 11 during operation of the sensing system in accordance with an example.

FIG. 12 is a timing diagram 1200 illustrating changes of voltages $V_{X\_A}$ and $V_{X\_B}$ at the first and second input terminals 1102a and 1102b during operation of the sensing system 1100 of FIG. 11 in accordance with an example. The timing diagram 1200 demonstrates the voltages $V_{X\_A}$ and $V_{X\_B}$ respectively at 1202 and 1204, the first and second charging signals $S_{CH\_A}$ and $S_{CH\_B}$ respectively at 1206 and 1208, the first and second transferring signals $S_{TR\_A}$ and $S_{TR\_B}$ respectively at 1210 and 1212, the first to fourth coupling signals $S_{1\_A}$, $S_{2\_A}$, $S_{1\_B}$ and $S_{2\_B}$ respectively at 1214 to 1220, the first holding signal and sampling signal $S_{H\_1}$ and $S_{S\_1}$ respectively at 1222 and 1224, and the second holding signal and sampling signal $S_{H\_2}$ and $S_{S\_2}$ respectively at 1426 and 1428, and the fifth to eighth coupling signals $S_{3\_A}$, $S_{1\_A}$, $S_{3\_B}$ and $S_{1\_B}$ respectively at 1230 to 1236. The charging phases of the second capacitive sensor 1202b are synchronized with the charging phases of the first capacitive sensor 1102a. A gap time 1438 is provided between charging and transferring to ensure break-before-make switch action.

Figure 13:
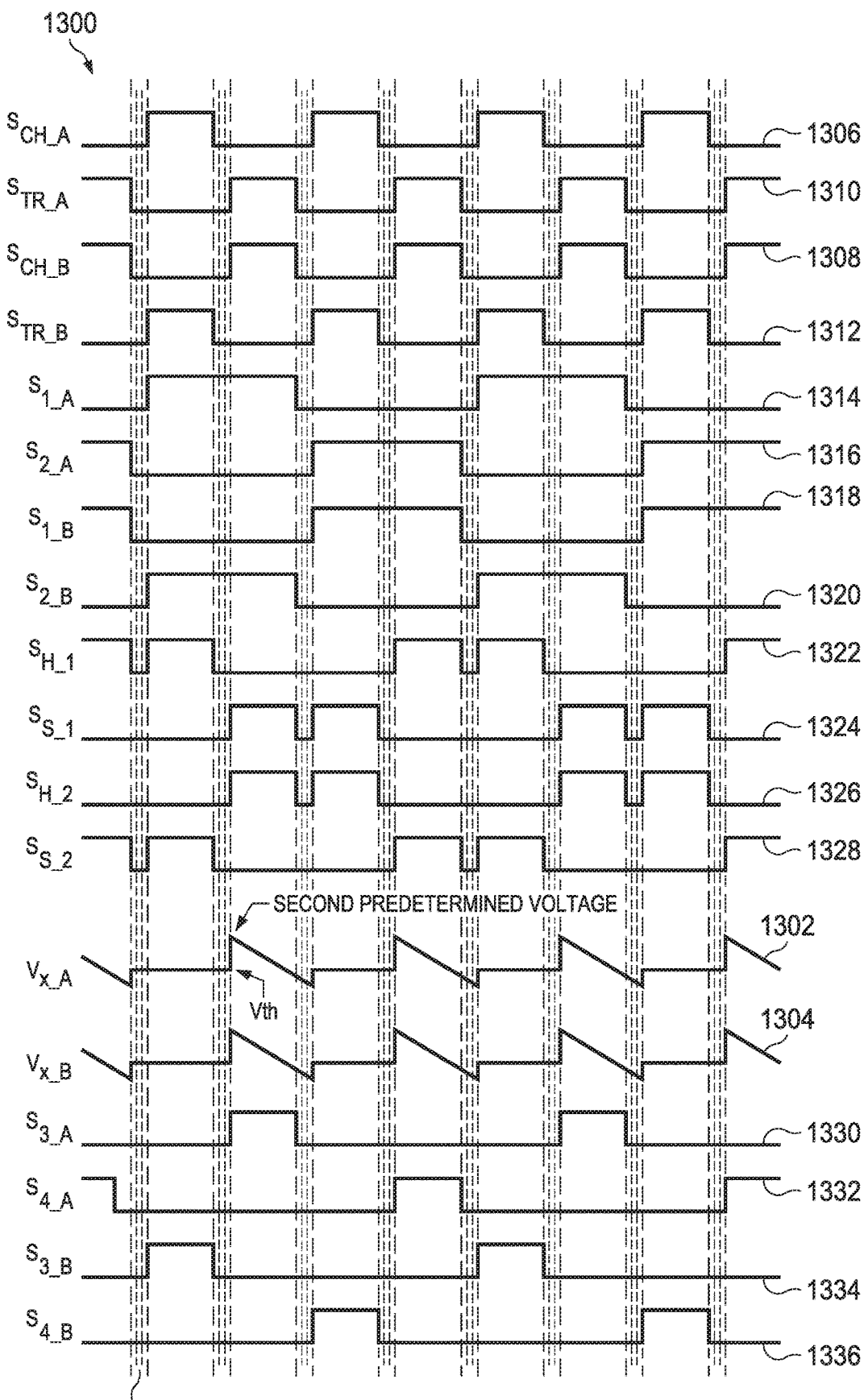
FIG. 13 is a timing diagram illustrating changes of voltages at the first and second input terminals of the sensing system of FIG. 11 during the operation of the sensing system in accordance with another example.

FIG. 13 is a timing diagram 1300 illustrating changes of voltages at the first and second input terminals 1102a and 1102b of the sensing system 1100 of FIG. 13 under the control of a controller 1108 in accordance with another example. The timing diagram 1300 is substantially similar to the timing diagram 1200 except that the charging phase of the second capacitive sensor 1102b is half-cycle phase shifted with reference to the charging phase of the first capacitive sensor 1102a.

Figure 14:
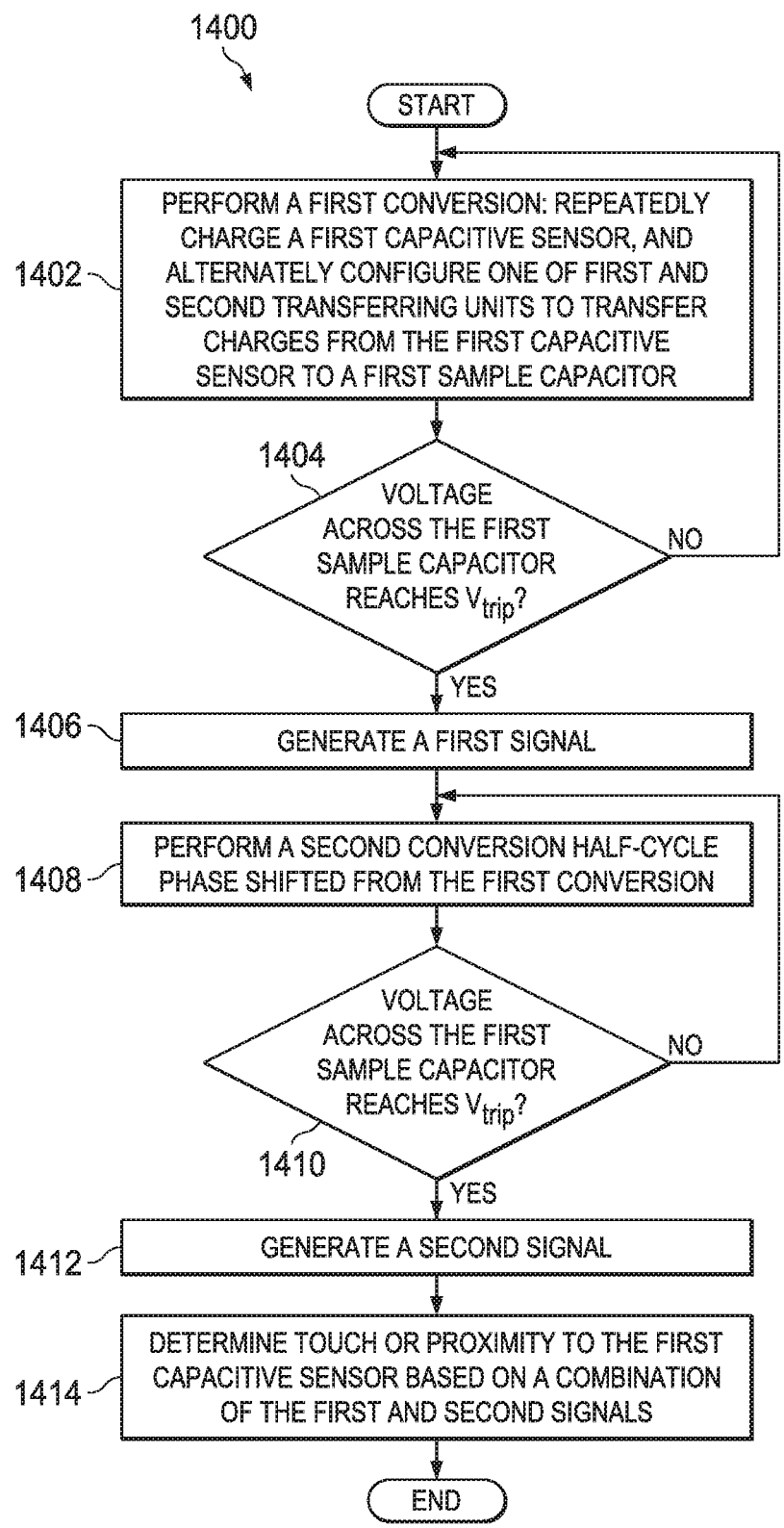
FIG. 14 is a flow chart of a method for sensing touch or proximity in accordance with a fifth embodiment of the present disclosure.

Referring to FIG. 14, a flow chart of a method 1400 for sensing touch or proximity to a first capacitive sensor with a sensing system in accordance with a fifth embodiment of the present disclosure is shown. The sensing system, with reference to the sensing system 100 of FIG. 1, includes first and second switching units 108a and 108b configured to selectively electrically couple any one of the second number of transferring units 106 to any one of the first number of input terminals 104 of the sensing system 100, wherein at least one of the first and second numbers is equal to or greater than two. In the example shown in FIG. 1, the sensing system 100 includes first and second input terminals 104a and 104b, and first and second transferring units 106a and 106b.

Starting at step 1402, where a first conversion is performed. The sensing system 100 configures the first capacitive sensor 102a of FIG. 1 to be repeatedly charged and discharged in successive cycles, wherein when discharging the first capacitive sensor 102a includes alternately configuring one of the first and second transferring units 106a and 106b to transfer charges from the first capacitive sensor 102a through the first input terminal 104a to a first sample capacitor 110a.

The charging and transferring cycle repeats until a voltage difference across the first sample capacitor 110a reaches a trip voltage $V_{trip}$ determined at step 1404 by a determining unit 118.

At step 1406, the determining unit 118 generates a first signal $N_{1x}$ indicative of a number of the cycles in the first conversion.

At step 1408, a second conversion is performed. The second conversion is similar to the first conversion except that the charging and transferring phases of the second conversion are half-cycle phase shifted with reference to those of the first conversion.

The charging and transferring cycle repeats until a voltage difference across the first sample capacitor 110a again reaches the trip voltage $V_{trip}$ determined at step 1410 by the determining unit 118.

At step 1412, the determining unit 118 generates a second signal $N_{2x}$ indicative of a number of the cycles in the first conversion.

At step 1414, the determining unit 118 determines the touch or proximity to the first capacitive sensor 102a based on a final count $N_x$ which is a combination of the first and second signals $N_{1x}$ and $N_{2x}$. In one example, the final count $N_x$ is defined in accordance with the equation (1).

In a preferred embodiment, the touch or proximity to a second capacitive sensor 102b coupled to the second input terminal 104b of the sensing system 100 is determined based on a combination of third and fourth signals generated in a same manner, wherein the first and second switching units 108a and 108b reciprocally configure each of the first and second transferring unit 106a and 106b to alternately transfer charges from the first capacitive sensor 102a to the first sample capacitor 110a, and from the second capacitive sensor 102b to the second sample capacitor 110b.

In another preferred embodiment, the determining unit 118 determines the touch or proximity to both the first and second capacitive sensors 102a and 102b based on a combination of the first and third signals.

Figure 15:
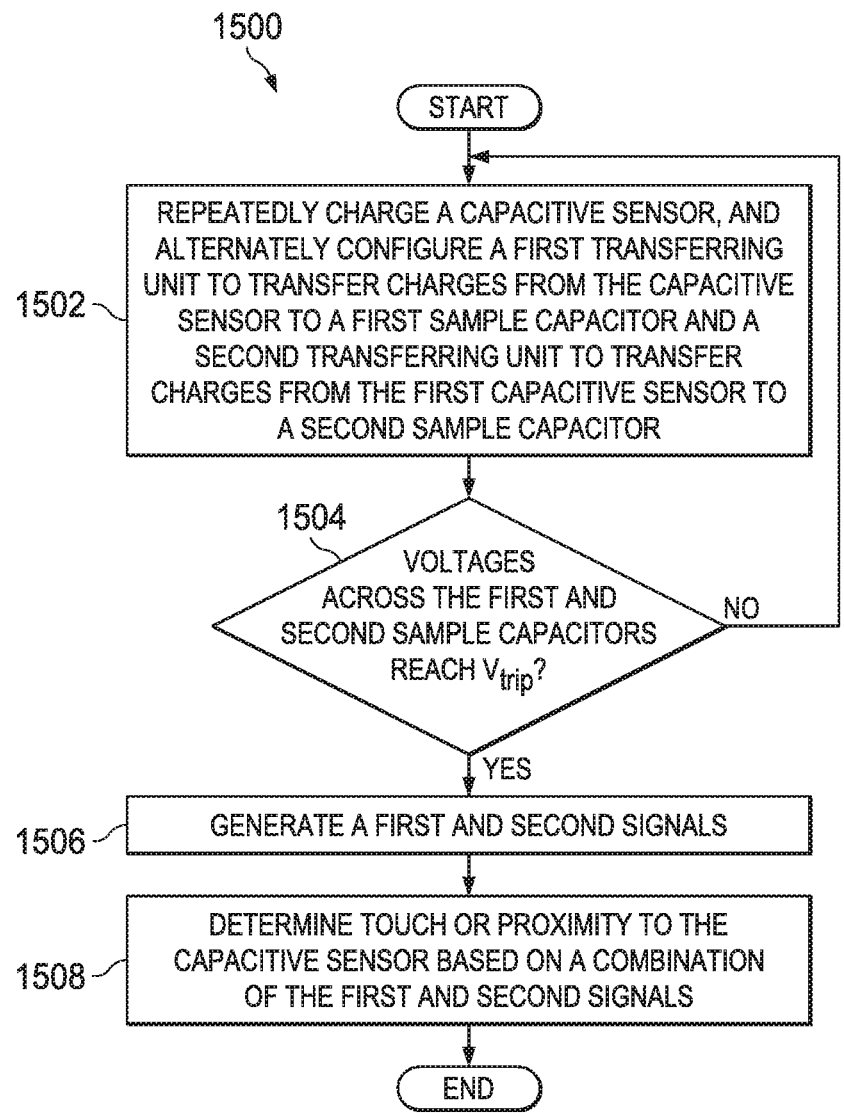
FIG. 15 is a flow chart of a method for sensing touch or proximity in accordance with a sixth embodiment of the present disclosure.

Referring to FIG. 15, a flow chart of a method 1500 for sensing touch or proximity to a capacitive sensor with a sensing system in accordance with a sixth embodiment of the present disclosure is shown. The sensing system, with reference to the sensing system 800 of FIG. 8, includes a first switching unit 808a configured to selectively electrically couple any one of the second number of transferring units 806 to transfer charges from any one of the first number of input terminals 804 of the sensing system 800, wherein at least one of the first and second numbers is equal to or greater than two. In the example shown in FIG. 9, the sensing system 800 includes one input terminal 804a, and first and second transferring units 806a and 806b.

Starting at step 1502, where a first conversion is performed. The sensing system 800 configures the capacitive sensor 802a to be repeatedly charged and discharged in successive cycles, wherein discharging the first capacitive sensor 802a includes alternately configuring the first transferring unit 806a to transfer charges 804a from the capacitive sensor 802a to the first sample capacitor 810a, and the second transferring unit 806b to transfer charges from the first capacitive sensor 802a to the second sample capacitor 810b.

The charging and transferring cycle repeats until a voltage difference across the first sample capacitor 810a reaches a first trip voltage $V_{trip1}$ and a voltage difference across the second sample capacitor 810b reaches a second trip voltage $V_{trip2}$ determined at step 1504 by a determining unit 818. In a preferred embodiment the first and second trip voltages $V_{trip1}$ and $V_{trip2}$ are equal to a same predetermined trip voltage $V_{trip}$.

At step 1506, the determining unit 818 generates a first signal $N_1$ indicative of a number of the cycles to charge the voltage difference across the first sample capacitor 810a to the first trip voltage $V_{trip1}$, and a second signal $N_2$ indicative of a number of the cycles to charge the voltage difference across the second sample capacitor 810b to the second trip voltage $V_{trip2}$.

At step 1508, the determining unit 818 determines the touch or proximity to the first capacitive sensor 802a based on a final count N which is a combination of the first and second signals $N_1$ and $N_2$. In one example, the final count N is defined in accordance with the equation (8).

Figure 16:
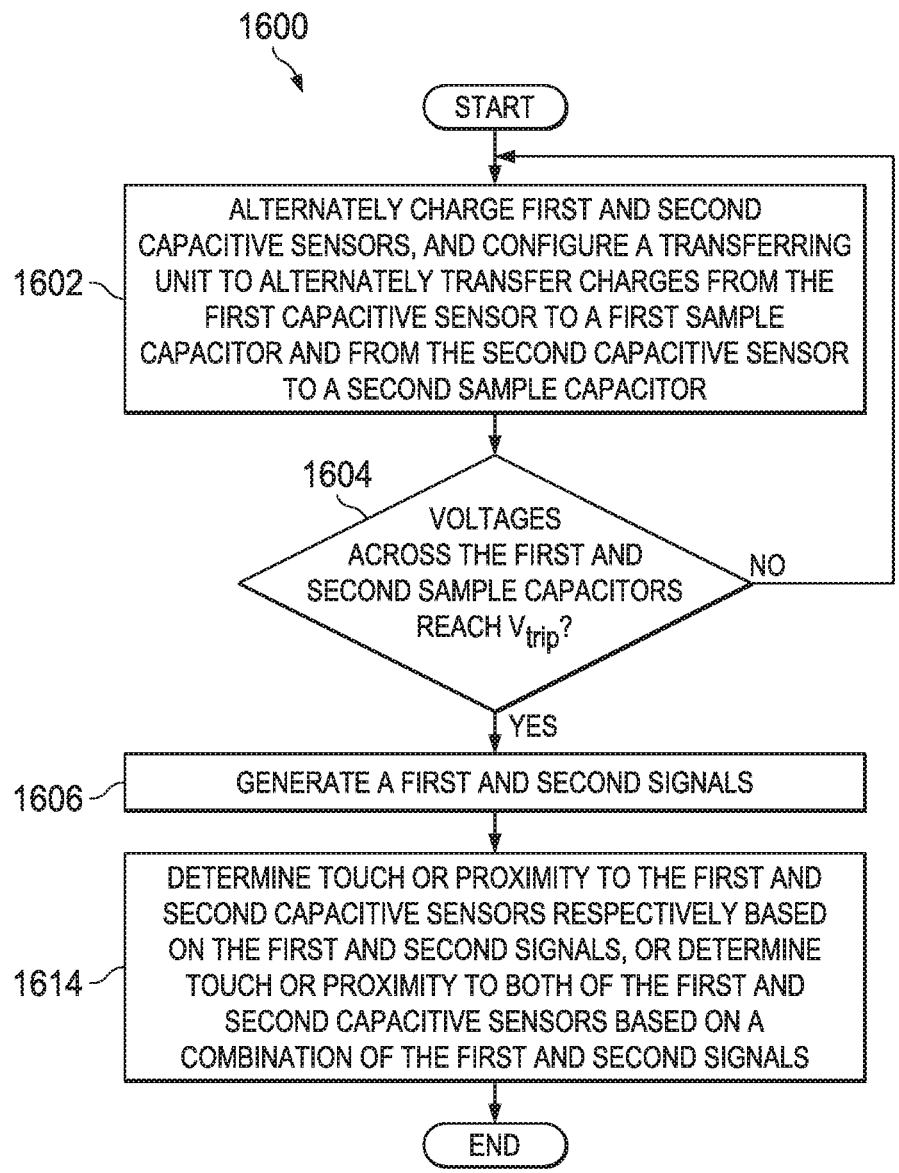
FIG. 16 is a flow chart of a method for sensing touch or proximity in accordance with a seventh embodiment of the present disclosure.

Referring to FIG. 16, a flow chart of a method 1600 for sensing touch or proximity to first and second capacitive sensors with a sensing system in accordance with a seventh embodiment of the present disclosure is shown. The sensing system, with reference to the sensing system 900 of FIG. 9, includes first and second input terminals 904a and 904b respectively coupled to first and second capacitive sensors 902a and 902b, and one transferring until 906a.

Starting at step 1602, the sensing system 900 configures the first and second capacitive sensors 902a and 902b to be alternately charged and discharged in successive cycles, wherein discharging the first and second capacitive sensors 902a and 902b includes configuring the transferring unit 906a to alternately transfer charges from the first capacitive sensor 902a through the first input terminal 904a to the first sample capacitor 910a and from the second capacitive sensor 902b through the second input terminal 904b to the second sample capacitor 910a.

The charging and transferring phases of the first and second capacitive sensors 902a and 902b repeat respectively until a voltage difference across the corresponding sample capacitor 910a/910b reaches a trip voltage $V_{trip}$ determined at step 1604 by a determining unit 918.

At step 1606, the determining unit 918 generates first and second signals $N_A$ and $N_B$, wherein the first signal $N_A$ is indicative of a number of the cycles to charge a voltage difference across the first sample capacitor 910a to the trip voltage $V_{trip}$ and the second signal $N_B$ is indicative of a number of the cycles to charge a voltage difference across the second sample capacitor 910b to the trip voltage $V_{trip}$ in the first conversion.

At step 1808, the determining unit 918 determines the touch or proximity to the first and second capacitive sensors 1102a and 1102b respectively based on the first and second signals $N_A$ and $N_B$. In another example, in parallel scanning configuration, the determining unit 918 determines the touch or proximity to both of the first and second capacitive sensors 1102a and 1102b based on a combination of the first and second signals $N_A$ and $N_B$ in accordance with the equation (7).

Similarly, as discussed above, touch or proximity to each of the first and second capacitive sensors 902a and 902b can be determined based on two conversions with half-cycle phase shifted to eliminate the impact of the input noise.

The description of the preferred embodiments of the present disclosure has been presented for purposes of illustration and description, but is not intended to be exhaustive or to limit the invention to the forms disclosed. Numerous modifications, changes, variations, substitutions, and equivalents will be apparent to those skilled in the art, without departing from the spirit and scope of the present disclosure, as described in the claims.

The invention claimed is:

1. A system for sensing touch or proximity, comprising:
 a first number of input terminals configured to couple one or more capacitive sensors;
 a second number of transferring units configured to transfer charges from the one or more capacitive sensors through the first number of input terminals in transferring phases of cycles of the one or more capacitive sensors, wherein at least one of the first and second numbers is equal to or greater than two; and
 a first switching unit, coupled between the first number of input terminals and the second number of transferring units, configured to selectively electrically couple any one of the first number of input terminals to any one of the second number of transferring units in the transferring phases.

2. The system of claim 1, wherein the first number of input terminals comprise a first input terminal configured to couple a first capacitive sensor and the second number of transferring units comprise first and second transferring units, wherein the first switching unit is configured to electrically couple the first input terminal alternately to one of the first and second transferring units in each transferring phase of the first capacitive sensor.

3. The system of claim 2, further comprising a second switching unit coupled to the second number of transferring units, wherein the first and second switching units are configured to electrically couple an alternate one of the first and second transferring units between the first input terminal and a first sample capacitor in a transferring phase of each cycle of the first capacitive sensor to transfer charges charged to the first capacitive sensor in a charging phase of the cycle to the first sample capacitor, the touch or proximity is determined based on a number of cycles for charging a voltage difference across the first sample capacitor to a first trip voltage.

4. The system of claim 3, wherein the system performs first and second conversions, the cycles of the first capacitive sensor in the second conversion being half-cycle phase shifted with respect to the cycles of the first capacitive sensor in the first conversion, wherein in each of the first and second conversions, a voltage difference across the first sample capacitor is charged to the first trip voltage, wherein the system further comprises a determining unit, coupled to the first sample capacitor, configured to generate a first signal indicative of a number of the cycles in the first conversion and a second signal indicative of a number of the cycles in the second conversion, wherein the touch or proximity to the first capacitive sensor is determined based on a combination of the first and second signals.

5. The system of claim 3, wherein the first number of input terminals further comprise a second input terminal configured to couple a second capacitive sensor, wherein the first and second switching units are configured to electrically couple an alternate one of the first and second transferring units between the second input terminal and a second sample capacitor in transferring phases of the second capacitive sensor.

6. The system of claim 5, wherein the cycles of the second capacitive sensor is half-cycle phase shifted with respect to the cycles of the first capacitive sensor.

7. The system of claim 5, wherein the cycles of the second capacitive sensor is synced with the cycles of the first capacitive sensor, wherein the first and second switching units are configured to electrically couple the first and second transferring units alternately and reciprocally between the first input terminal and the first sample capacitor, and between the second input terminal and the second sample capacitor.

8. The system of claim 5, wherein the system further comprises a determining unit coupled to the first and second sample capacitors, the determining unit generating a first signal indicative of a number of the cycles for charging a voltage difference across the first sample capacitor to a first trip voltage, and a second signal indicative of a number of the cycles for charging a voltage difference across the second sample capacitor to a second trip voltage, wherein the touch or proximity to both the first and second capacitive sensors is determined based on a combination of the first and second signals.

9. The system of claim 2, wherein the first and second switching units are configured to alternately electrically couple the first transferring unit between the first input terminal and the first sample capacitor, and the second transferring unit between the first input terminal and the second sample capacitor, wherein the system further comprises a determining unit coupled to the first and second sample capacitors, the determining unit generating a first signal indicative of a number of the cycles for charging a voltage difference across the first sample capacitor to a first trip voltage; and a second signal indicative of a number of the cycles for charging a voltage difference across the second sample capacitor to a second trip voltage, wherein the touch or proximity to the first capacitive sensor is determined based on a combination of the first and second signals.

10. The system of claim 1, wherein the first number of input terminals comprise first and second input terminals configured to respectively couple first and second capacitive sensors, and the second number of transferring units comprise a transferring unit, wherein the system further comprises a second switching unit coupled between the transferring unit and first and second sample capacitors, wherein the first and second switching units are configured to electrically couple the transferring unit alternately between the first input terminal and the first sample capacitor, and between the second input terminal and the second sample capacitor.

11. A method of operating a touch or proximity sensing system comprising a first number of input terminals and a second number of transferring units, comprising:
charging one or more capacitive sensors in charging phases of multiple cycles of the one or more capacitive sensors; and
selectively configuring any one of the second number of transferring units to transfer charges from the one or more capacitive sensors through any one of the first number of input terminals in a transferring phase of each cycle, wherein at least one of the first and second numbers is equal to or greater than two.

12. The method of claim 11, wherein the first number of input terminal comprise a first input terminal configured to couple a first capacitive sensor and the second number of transferring units comprise first and second transferring units, the method comprising alternately configuring one of the first and second transferring units to transfer the charges from the first capacitive sensor.

13. The method of claim 12, further comprising:
alternately configuring one of the first and second transferring units to transfer the charges from the first capacitive sensor to a first sample capacitor in each transferring phase.

14. The method of claim 13, further comprising:
charging a voltage difference across the first sample capacitor to a first trip voltage in a first conversion and generating a first signal that indicates a number of the cycles in the first conversion;
charging the voltage difference across the first sample capacitor to the first trip voltage in a second conversion and generating a second signal that indicates a number of the cycles in the second conversion, wherein the cycles in the second conversion are half-cycle phase shifted with respect to the cycles in the first conversion; and
determining the touch or proximity to the first capacitive sensor based on a combination of the first and second signals.

15. The method of claim 13, wherein the first number of input terminals further comprise a second input terminal configured to couple a second capacitive sensor, the method comprising:
alternately configuring one of the first and second transferring units to transfer charges from the second capacitive sensor to a second sample capacitor in each transferring phase of the second capacitive sensor.

16. The method of claim 15, further comprising reciprocally and alternately configuring the first and second transferring units to transfer the charges from the first capacitive sensor to the first sample capacitor, and from the second capacitive sensor to the second sample capacitor.

17. The method of claim 16, further comprising:
generating a first signal indicative of a number of the cycles for charging a voltage difference across the first sample capacitor to a first trip voltage, and a second signal indicative of a number of the cycles for charging a voltage difference across the second sample capacitor to a second trip voltage; and
determining the touch or proximity to both the first and second capacitive sensors based on a combination of the first and second signals.

18. The method of claim 12, further comprising:
configuring the first and second transferring units to alternately transfer the charges respectively to first and second sample capacitors;
generating a first signal indicative of a number of the cycles for charging a voltage difference across the first sample capacitor to a first trip voltage and a second signal indicative of a number of the cycles for charging a voltage difference across the second sample capacitor to a second trip voltage; and
determining the touch or proximity to the first capacitive sensor based on a combination of the first and second signals.

19. The method of claim 11, wherein the first number of input terminals comprise first and second input terminals respectively configured to couple first and second capacitive sensors, and the second number of transferring units comprise a transferring unit, wherein the method comprises:
configuring the transferring unit to alternately transfer the charges from the first capacitive sensor to a first sample capacitor, and from the second capacitive sensor to a second sample capacitor.

20. The method of claim 19, further comprising:
charging a voltage difference across the first sample capacitor to a first trip voltage in a first conversion and generating a first signal indicative of a number of the cycles in the first conversion;
charging the voltage difference across the first sample capacitor to the first trip voltage in a second conversion and generating a second signal indicative of a number of the cycles in the second conversion, wherein the cycles in the second conversion are half-cycle phase shifted with reference to the cycles in the first conversion; and
determining the touch or proximity to the first capacitive sensor based on a combination of the first and second signals.

* * * * *